United States Patent
Kosic et al.

(10) Patent No.: US 7,920,009 B2
(45) Date of Patent: Apr. 5, 2011

(54) METHOD AND DEVICE FOR COMPARATOR OFFSET CANCELLATION

(75) Inventors: Stephen Robert Kosic, San Diego, CA (US); Eric John Siragusa, Escondido, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/397,934

(22) Filed: Mar. 4, 2009

(65) Prior Publication Data

US 2010/0225358 A1     Sep. 9, 2010

(51) Int. Cl.
  *H03L 5/00*     (2006.01)
(52) U.S. Cl. .................. 327/307; 327/65; 327/89
(58) Field of Classification Search .......... 327/63–68, 327/87, 89, 307
  See application file for complete search history.

(56) References Cited

U.S. PATENT DOCUMENTS

| | | | | |
|---|---|---|---|---|
| 6,750,704 B1* | 6/2004 | Connell et al. | | 330/9 |
| 7,498,850 B2* | 3/2009 | Hendrickson | | 327/63 |
| 2007/0229046 A1* | 10/2007 | Johnson et al. | | 323/282 |

OTHER PUBLICATIONS

Razavi, Behzad, 1995, Principles of Data Conversion System Design, Precision Techniques, pp. 201-208, Sect 8.1.4.

* cited by examiner

*Primary Examiner* — Quan Tra
(74) *Attorney, Agent, or Firm* — Kenyon & Kenyon LLP

(57) ABSTRACT

A method and a device for canceling an offset voltage in an output of a comparator circuit include sampling a set of offset voltages; applying a set of correction voltages equal in magnitude and opposite in polarity to the set of offset voltages, the set of correction voltages being applied to an output generating arrangement of the comparator circuit; and enabling output of the output generating arrangement after the set of correction voltages is applied.

19 Claims, 4 Drawing Sheets

METHOD AND DEVICE FOR COMPARATOR OFFSET CANCELLATION

BACKGROUND INFORMATION

Electronic components such as switches are subject to operating characteristic variations. Although devices may be manufactured according to specification, no manufacturing technique can guarantee uniformity across all devices. Thus, devices which are supposedly the same, e.g., two n-channel metal-oxide-semiconductor (NMOS) transistors that have the same stated dimensions, may vary slightly in terms of operating characteristic. In switching devices, this variation is often manifested as a shifting of a threshold voltage level. Depending on the context in which the devices are used, the variation may not matter. However, in some applications, a high degree of accuracy is desirable and variation among devices can affect the overall performance of a circuit. When the variation of a device with respect to another device is of a sufficient magnitude, this is known as device mismatch. If the mismatch occurs in a comparator circuit, this may result in a comparator offset, which is a voltage offset that limits the accuracy of the comparator by affecting the performance of a comparison between an input voltage and a reference voltage. One method of circumventing the problem of device mismatch is to make devices sufficiently large to reduce the effects of variation. However, increasing device size also increases power requirements while reducing the amount of space available for additional devices. Accordingly, a need exists for comparators with a high degree of accuracy and low power consumption.

SUMMARY

A first example embodiment of the present invention relates to a method canceling a set of offset voltages at the output of a comparator circuit, including the steps of sampling the set of offset voltages; and applying a set of correction voltages equal in magnitude and opposite in polarity to the set of offset voltages. The set of correction voltages are applied to an output generating arrangement of the comparator circuit. The method also includes enabling output of the output generating arrangement after the set of correction voltages is applied.

A second example embodiment of the present invention relates to a comparator circuit including a pair of transistors configured to generate an output of the comparator circuit, output nodes of the comparator circuit being connected to drain terminals of the transistors; and a pair of capacitors, first plates of the capacitors being connected to respective ones of the output nodes. The circuit also includes a first switch configured to cause the capacitors to sample an offset voltage at each of the output nodes; a first set of switches configured to connect second plates of the capacitors to respective gates of the transistors; and a second switch configured to disable the output by shorting the output nodes.

A third example embodiment of the present invention relates to a device canceling a set of offset voltages in an output of a comparator circuit. The device includes a pair of capacitors, first plates of the capacitors being connected to a respective node associated with the output. The device also includes a switch configured to cause the capacitors to sample the set of offset voltages; and a switch configured to connect second plates of the capacitors to respective inputs of an output generating arrangement of the comparator circuit, such that a set of correction voltages equal in magnitude and opposite in polarity to the set of offset voltages is generated at the second plates. The device also includes a switch configured to enable the generation of the output after the second plates are connected.

DETAILED DESCRIPTION OF EXAMPLE EMBODIMENTS

The present invention relates to methods and devices for comparator offset cancellation. Exemplary embodiments of the present invention are described with reference to a comparator used in an analog-to-digital (A/D) converter. However, it will be appreciated that the present invention may be implemented in any application in which a comparator or latch is used.

Figure 1:
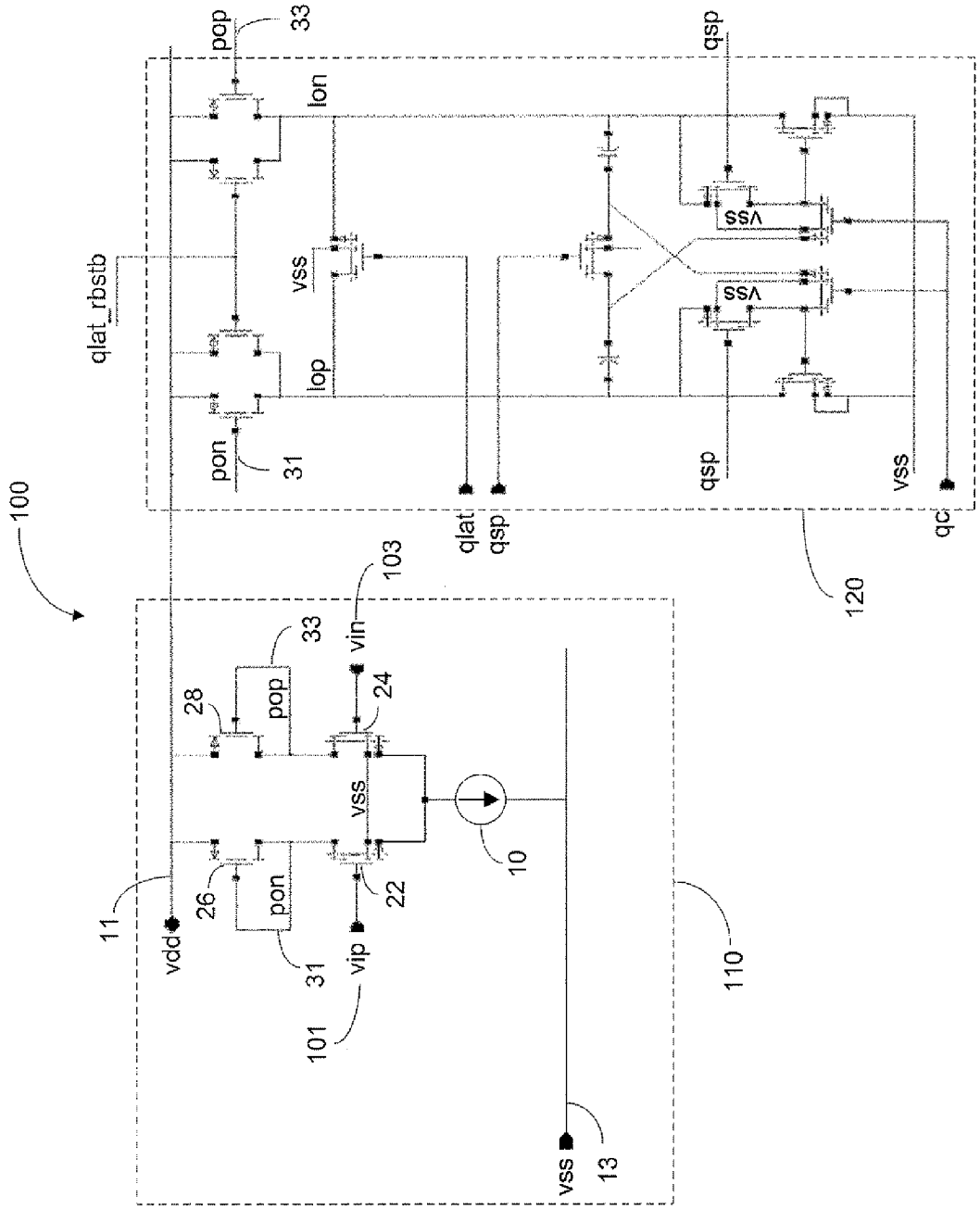
FIG. 1 shows a detailed schematic of a comparator according to an example embodiment of the present invention.

FIG. 1 shows a detailed schematic of a comparator 100 according to an example embodiment of the present invention. The comparator 100 may be used as part of an A/D converter, e.g., a flash converter in which a plurality of comparators is used to compare an analog input signal to a set of reference voltages. The number of comparators may be varied depending on a desired level of accuracy. For example, increasing the number of voltage comparisons enables the voltage level of the analog input signal to be more accurately determined. However, any one of the comparators may be subject to an error-causing offset voltage. As the number of comparators is increased, the effects of offset error also increase, as the magnitude of the difference between the reference voltages going to two different comparators may decrease while their offsets do not, thus reducing accuracy. Further, an error may be carried forward to other devices that receive the comparator's output if the A/D converter is a multi-stage converter. Thus, the accuracy of the entire A/D converter (as well as any devices that depend on the output of the A/D converter) may be affected by the offset error.

For illustration purposes, FIG. 1 shows only a pre-amplifier (pre-amp) portion 110 and a latch portion 120 of a comparator circuit. Components for generating the actual input signal and reference signal have been omitted and it may be assumed that voltage inputs of the comparator 100 correspond to a difference between an input voltage and a reference voltage. The pre-amp 110 converts this voltage difference into a current signal, which is then converted back to a voltage that becomes the input to the latch 120 to determine the final output of the comparator 100.

As shown in FIG. 1, the comparator 100 may include the pre-amp 110 and the latch 120. The pre-amp 110 and the latch 120 are respectively shown in dashed lines. The pre-amp 110 may include a pair of p-channel metal-oxide-semiconductor (PMOS) transistors 26, 28, a pair of NMOS transistors 22, 24, and a current source 10. Drain terminals of the transistors 26, 28 are respectively connected to drain terminals of the transistors 22, 24. The drain terminals of the transistors 26, 28 are also connected to gates of their respective transistors. Source terminals of the transistors 26, 28 are connected to a supply voltage Vdd 11. Gates of the transistors 22, 24 are respectively connected to input signals vip 101 and vin 103. Vip 101 is a signal representing a common voltage, plus a positive input voltage plus a negative reference voltage. Vin 103 is a signal representing a common voltage, plus a negative input voltage minus a positive reference voltage. The input voltages are of the same magnitude. The reference voltages are also of the same magnitude. Thus, vip 101 and vin 103, minus the common voltage, are of the same magnitude, but opposite polarity. Vip and vin together form the differential input signal to the comparator. In an alternative representation one of the input signals could represent the input voltage, while the other the reference voltage. The source terminals of the transistors 22, 24 are connected to each other and to the current source 10. Backgate terminals of the transistors 22, 24 are connected to each other and to a substrate voltage Vss 13.

The pre-amp 10 operates to convert the input signals vip 101 and vin 103, which are voltages, into current signals associated with a set of output voltages pon 31 and pop 33, which are then output to the latch 120. The current source 10 connects the source terminals of the transistors 22, 24 to Vss 13 and provides a tail current for these two transistors. The tail current may be controllable by, for example applying a voltage bias to the current source 10. A differential input voltage of vip 101 with respect to vin 103 is therefore converted to a differential current, which is then mirrored into the latch 120.

Based on the above description of the pre-amp 110, it can be seen that a device mismatch may occur well before any output to the latch 120. For example, the transistors 26 and 28, and 22 and 24 may respectively be the same stated dimensions so that, ideally, the operating characteristics of the two branches associated with vip 101 and vin 103 are the same. However, a device mismatch can shift the tun-on threshold of any of the transistors 26, 28, 22, and 24, resulting in an offset current which may be considered as creating an offset voltage superimposed onto either of the signals pon 31 and pop 33. Mismatches may also occur within the latch 120, which will now be described with reference to FIG. 2.

Figure 2:
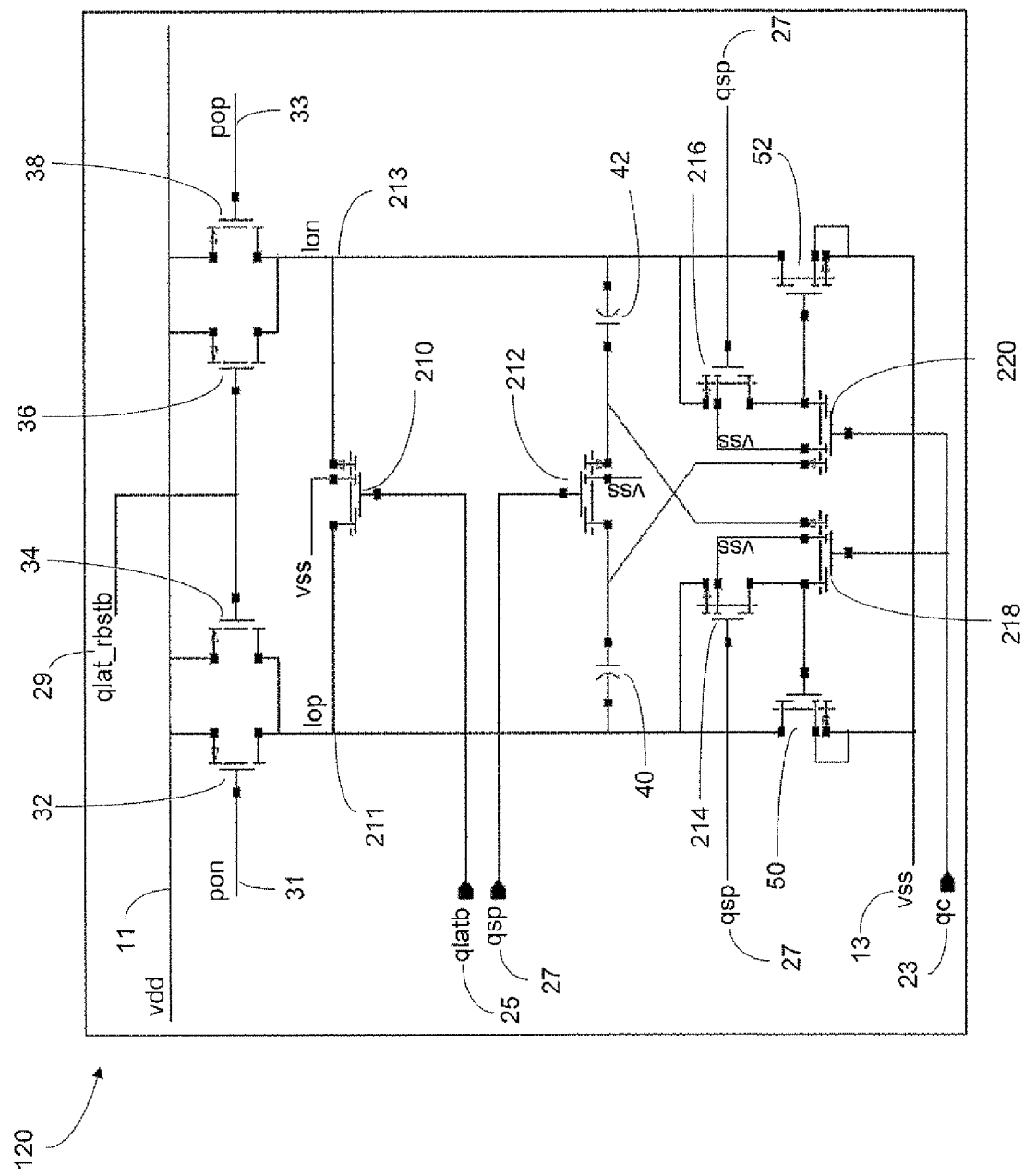
FIG. 2 shows a detailed schematic of a latch component of the comparator of FIG. 1.

FIG. 2 shows a detailed schematic of the latch 120, which may include a set of PMOS transistors 32, 34, 36 and 38, and a set of NMOS transistors 210, 212, 214, 216, 218, and 220. The transistors 32, 38 respectively receive the signals pon 31 and pop 33 as gate inputs. In this manner, the transistors 32, 38 operate as current mirrors that duplicate the currents respectively flowing through the transistors 26 and 28 of the pre-amp 110. Source terminals of the transistors 32, 34, 36, and 38 are connected to Vdd 11. Drain terminals of the transistors 32, 34 are connected to a drain terminal of the transistor 210, to a first plate of a capacitor 40, to a first source terminal of the transistor 214, and to a drain terminal of the transistor 50. Drain terminals of the transistors 36, 38 are connected to a first source terminal of the transistor 210, to a first plate of a capacitor 42, to a first source terminal of the transistor 216, and to a drain terminal of the transistor 52. Gates of the transistors 34, 38 are connected to a clock signal qlat_rbstb 29.

The transistors 210, 212, 214, 216, 218, and 220 operate as switches that place the latch 120 into different configurations, as will be discussed further below. As described above, the drain terminal and the first source terminal of the switch 210 are respectively connected to the drain terminals of the transistors 32, 34 and 36, 38. The drain terminal and first source terminal of the switch 210 also respectively provide output signals lop 211 and lon 213 of the latch 120. The switch 210 is controlled by a clock signal qlatb 25 connected to a gate thereof.

The switch 212 is controlled by a clock signal qsp 27 connected to a gate thereof. A drain terminal of the switch 212 is connected to a second plate of the capacitor 40 and to a first source terminal of the switch 220. A first source terminal of the switch 212 is connected to a second plate of the capacitor 42 and to a first source terminal of the switch 218.

The switches 214, 216 are controlled by qsp 27, which is connected to the gates thereof. Drain terminals of the switches 214, 216 are respectively connected to drain terminals of the switches 218, 220 and to gates of the transistors 50, 52.

The switches 218, 220 are controlled by a clock signal qc 23 connected to the gates thereof. Backgate terminals of the switches 210, 212, 214, 216, 218, and 220 are each connected to Vss 13.

The transistors 50, 52 perform a latching function when placed into a cross-coupled configuration. As explained below, the cross-coupled configuration enables the latch 120 to reach a binary decision where one of the transistors 50, 52 is on and the other is off. Drain terminals of the transistors 50, 52 provide outputs of the latch 120. In particular, the latch outputs are voltage signals lop 211 and lon 213, which are used elsewhere in the A/D converter. Source terminals of the transistors 50, 52 are connected to Vss 13.

Figure 3:
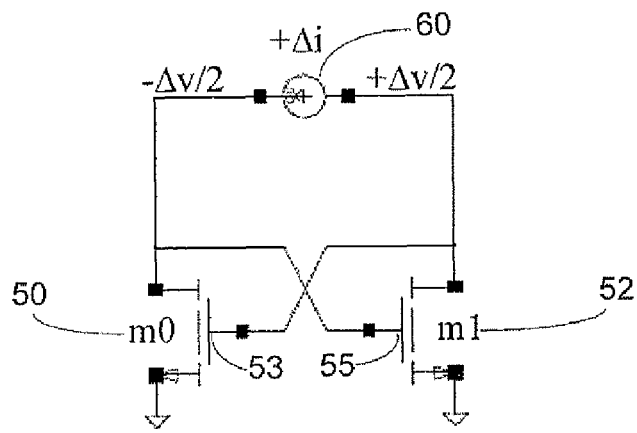
FIG. 3 shows a detailed schematic of a first latch configuration according to an example embodiment of the present invention.
Figure 4:
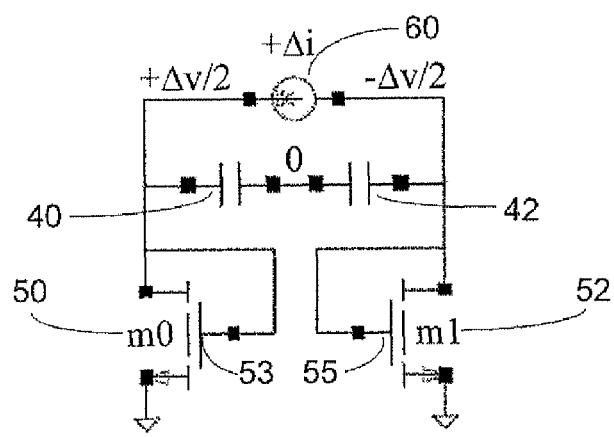
FIG. 4 shows a detailed schematic of a second latch configuration according to an example embodiment of the present invention.
Figure 5:
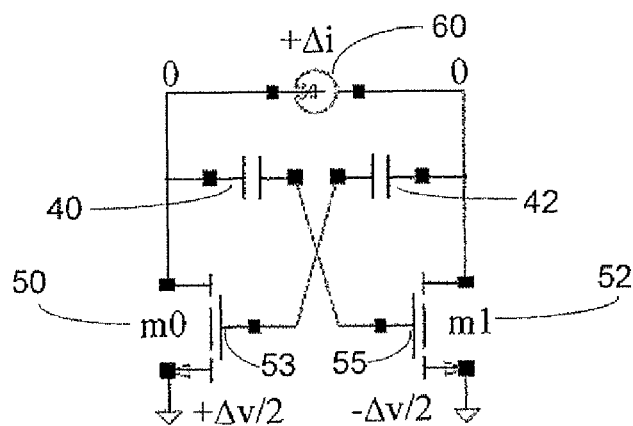
FIG. 5 shows a detailed schematic of a third latch configuration according to an example embodiment of the present invention.

FIGS. 3 to 5 show detailed schematics of latch configurations according to the present invention. The configurations shown illustrate a technique by which comparator offset can be cancelled. Referring to FIG. 3, a first configuration shows the transistors 50, 52 connected in a cross-coupled configuration in which the drain terminal of one transistor is connected to the gate of the other transistor. An offset current $\Delta i$ is shown as a conceptual current source 60 connected to the drains of the transistors 50, 52. $\Delta i$ manifests itself as a tilt, e.g., a voltage offset $\Delta v$, where $\Delta v$ is approximately $2*\Delta i/Gm$, and Gm is the transconductance of each transistor 50, 52. In the configuration of FIG. 3, the input impedance looking into the transistors 50, 52 is negative because of positive feedback associated with the cross-coupling. $\Delta i$ flows into the transistor 50 and out of the transistor 52, resulting in offset voltages of $-\Delta v/2$ at the gate of the transistor 52 and $+\Delta v/2$ at the gate of the transistor 50.

FIG. 4 shows a second configuration in which the transistors 50, 52 are diode-connected instead of being cross-coupled. That is, the gates of each transistor 50, 52 may be connected to the drain of the same transistor. In this manner, the transistors 50, 52 operate as diodes that are turned on when a threshold voltage is present at the gate. The diode connection also provides for negative feedback that stabilizes the output of the transistors 50, 52. The drains of the transistors 50, 52 are respectively connected to the first plates of the capacitors 40, 42. In one embodiment, the capacitors may be approximately 50 fF. The second plates of the capacitors 40, 42 are shorted together so that there is no potential at the second plates. Because the input impedance looking into each transistor 50, 52 is positive, the offset voltages at the drains are $+\Delta v/2$ and $-\Delta v/2$, respectively. The offset voltages $+\Delta v/2$ and $-\Delta v/2$ are respectively sampled across the capacitors 40, 42 and approximately equal to the offset voltages shown in FIG. 3. In reality, the offset voltage in FIG. 3 is $\Delta v=2*\Delta i/(Gm-Gds)$, where Gds is the transconductance between the drain and the source. In FIG. 4, $\Delta v=2*\Delta i/(Gm+Gds)$. However, because Gds is negligible compared to Gm, the offset voltages in FIGS. 3 and 4 are approximately equal. Thus, the configuration of FIG. 4 enables sampling of the offset voltages.

There is an attenuation of the voltage at the gate of the transistors 50, 52 due to the capacitor divider of 40 and 42 with a gate-to-source parasitic capacitance of the transistors 50, 52. Because of the attenuation, some fraction of the offset voltage sampled onto the capacitors 40, 42 is lost. That fraction of lost voltage is smaller if the capacitors 40, 42 are larger with respect to the transistors 50, 52, but this increases the capacitive loading on lop 211 and lon 213, which slows the regeneration time of the latch 120. The capacitors 40, 42 may therefore be sized relative to the size of transistors 50, 52. It will be understood then, that there exists a range of acceptable capacitances which trade off regeneration time of the latch in return for an amount of offset which can be cancelled.

FIG. 5 shows a third configuration in which the second plates of the capacitors 40, 42 are respectively connected to the gates of the transistors 50, 52. If this connection occurs after the offset voltages were sampled in FIG. 4, then correction voltages equal in magnitude, but opposite in polarity to the offset voltages are transferred across the capacitors 40, 42 to the gates of the transistors 50, 52, thereby canceling the offset voltages. Because the sampled offset voltages are only approximations of the actual offset voltage, cancellation is not complete. For a Gm of 0.134 mS and a Gds of 6 μS, the cancellation may be approximately 90%. However, because of attenuations due to parasitic gate capacitances, and depending on the size of the transistors 50, 52, the cancellation may drop to about 75% of the static error associated with preamp and latch mismatches. The configuration of FIG. 5 also allows for a latch decision to occur, since the transistors 50, 52 are cross-coupled through the capacitors 40, 42.

Figure 6:
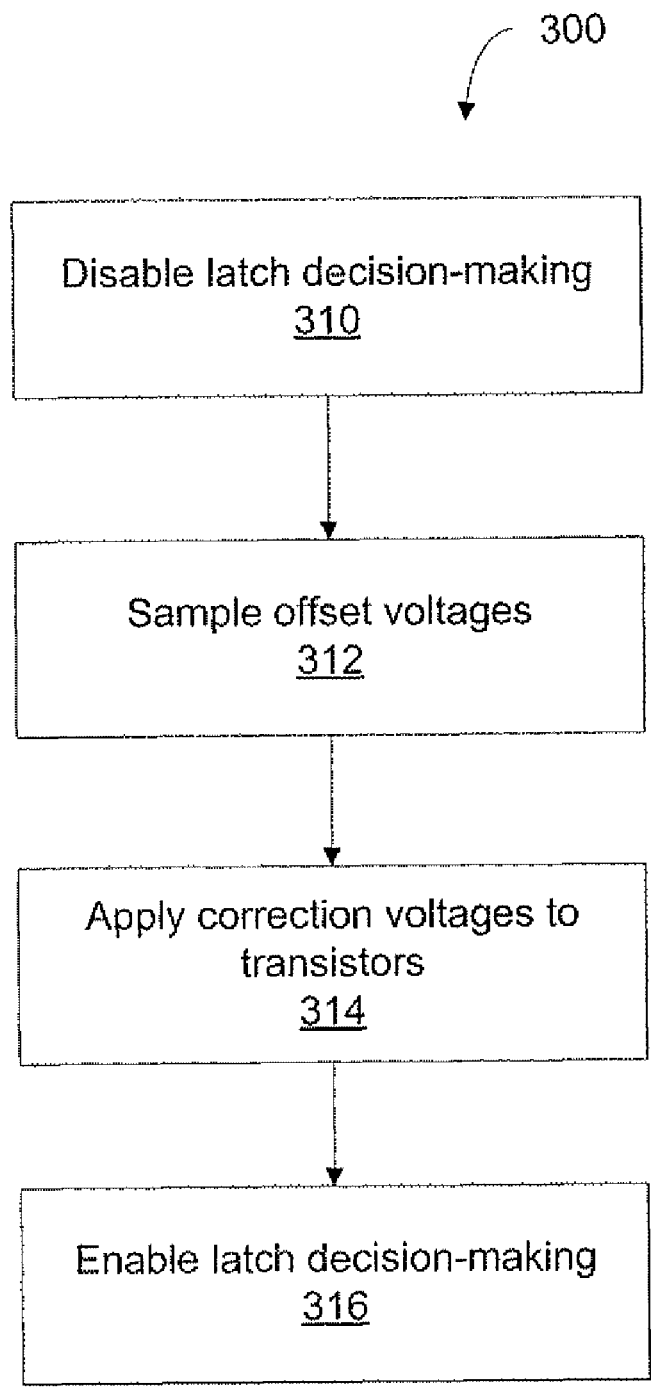
FIG. 6 shows a method for comparator offset cancellation according to an example embodiment of the present invention.

An offset cancellation technique associated with the configurations of FIGS. 3 to 5 is summarized in FIG. 6, which shows a method 300 for comparator offset cancellation according to an example embodiment of the present invention. The method 300 will be described with reference to FIG. 2. In 310, latch-decision making is disabled. Referring to FIG. 2, disabling may occur by setting qlatb 25 high, which turns on the switch 210 to short the drains of the transistors 32, 34, 36, and 38. At this time, the switches 214, 216, and 212 are off. The state of the latch 120 is the same state as during 314 (described below). In particular, the latch 120 is cross-coupled, but prevented from making a decision because of switch 210 shorting lop 211 to lon 213. If the latch 120 is not in the cross-coupled configuration then it cannot make a decision anyway because there is no positive feedback and thus no need to turn on the shorting switch 210.

In 312, the offset voltages are sampled. Qsp 27 is set high, turning on the switches 214, 216 to place the transistors 50, 52 into a diode-connected configuration. Qsp 27 also turns on the switch 212 to short the second terminals of the capacitors 40, 42. Qc 23 is low so the switches 218, 220 are off. Qlatb 25 is set low to prevent interference with sampling of the offset voltage, since it would change the effective impedance of lop/lon if the transistors 32, 34, 36, and 38 were shorted. Since the latch 120 is in diode-connected mode it can't make a decision, so there is no need to turn the switch 210 on at this time. This corresponds to the configuration shown in FIG. 4.

In 314, correction voltages are applied to the traisistors 50, 52. Qsp 27 is set low to disable the diode-connected configuration. Qc 23 is set high shortly after qsp 27 falls low, turning on the switches 218, 220 to place the latch 120 into the cross-coupled configuration of FIG. 5. At this time qlatb 25 is high, which prevents the latch 120 from making a decision.

In 316, decision-making is enabled by setting qlatb 25 low while qc 23 is still high. When qlatb 25 is low, the switch 210 is turned off so that the drains of the transistors 32, 34 are no longer shorted to those of the transistors 36, 38. As a result, decision-making is enabled and either lop 211 or lon 213 goes high while the other goes low. This binary decision indicates whether the input voltage is greater than the reference voltage. To accelerate decision-making, the signal qlat_rbstb 29 (which is initially set high) may be lowered sometime after qlatb 25 goes low. This promotes faster transistor regeneration time by increasing the positive feedback of the cross-coupled transistors 50, 52 when the transistors 34, 36 are turned on. The turning on of the transistors 34, 36 causes a dumping of additional current into the transistors 50, 52, increasing their transconductance Gm and the positive feedback. It will be understood that a decision would still be made regardless of whether the regeneration time is accelerated, although the decision may take longer.

After the decision-making in 316, the capacitors 40, 42 need not be discharged before repeating the method 300 to generate a new decision, because the capacitors 40, 42 get refreshed with the proper offset voltage in the next 312 phase.

Although the example embodiments of the present invention were described with reference to offset correction in a latch having NMOS transistors, it may also be possible to implement the invention using PMOS transistors or, in some circumstances, bi-polar junction transistors (BJTs). In the latter case, it may be necessary to take into consideration the base current of the BJTs.

In the preceding specification, the present invention has been described with reference to specific example embodiments thereof. It will, however, be evident that various modifications and changes may be made thereunto without departing from the broader spirit and scope of the present invention as set forth in the claims that follow. The embodiments described herein may be presented combined with each other in various combinations. The specification and drawings are accordingly to be regarded in an illustrative rather than restrictive sense.

What is claimed is:

1. A method for canceling a set of offset voltages in an output of a comparator circuit, comprising:
    sampling the set of offset voltages while maintaining an input to an output producing device of the comparator circuit;
    applying a set of correction voltages equal in magnitude and opposite in polarity to the set of offset voltages, the set of correction voltages being applied to an output generating arrangement of the comparator circuit;
    enabling output of the output generating arrangement after the set of correction voltages is applied; and
    performing the sampling by shorting second plates of a pair of sampling capacitors, first plates of the capacitors being connected to respective output nodes.

2. The method of claim 1, further comprising:
    prior to applying the set of correction voltages, disabling the output by shorting the output nodes.

3. The method of claim 1, further comprising:
    applying the set of correction voltages by connecting the second plates of the capacitors to respective inputs of the output generating arrangement.

4. The method of claim 1, wherein the output generating arrangement includes a pair of transistors, the method further comprising:
    placing the transistors into a diode-connected configuration during the sampling.

5. The method of claim 4, further comprising:
placing the transistors into a cross-coupled configuration during the applying of the correction voltages, wherein a drain terminal of one transistor is connected to a gate of the other transistor via one of the capacitors.

6. The method of claim 5, further comprising:
enabling the cross-coupled configuration until a subsequent sampling of the set of offset voltages is commenced.

7. The method of claim 1, further comprising:
switching between sampling and output enabling configurations using a plurality of switches.

8. The method of claim 1, wherein the set of offset voltages are approximations of actual offset voltages at the output.

9. A comparator circuit, comprising:
a pair of transistors configured to generate an output of the comparator circuit, output nodes of the comparator circuit being connected to drain terminals of the transistors;
a pair of capacitors, first plates of the capacitors being connected to respective ones of the output nodes;
a first switch configured to cause the capacitors to sample an offset voltage at each of the output nodes;
a first set of switches configured to connect second plates of the capacitors to respective gates of the transistors; and
a second switch configured to disable the output by shorting the output nodes.

10. The comparator circuit of claim 9, wherein when the second plates are connected to the respective gates, correction voltages equal in magnitude and opposite in polarity to the offset voltages are applied to the gates.

11. The comparator circuit of claim 9, wherein the first switch shorts the second plates together when turned on.

12. The comparator circuit of claim 9, wherein the second switch is configured to enable the output by removing the shorting of the output nodes after the second plates are connected to the respective gates.

13. The comparator circuit of claim 9, further comprising:
a second set of switches configured to, during sampling of the offset voltages, connect the drain terminal of each transistor to the gate of the same transistor.

14. The comparator circuit of claim 13, wherein the first switch, the second switch, the first set of switches, and the second set of switches are controlled to switch the comparator circuit between sampling and output enabling configurations.

15. The comparator circuit of claim 9, wherein the transistors are placed into a cross-coupled configuration by a turning on of the first set of switches, the cross-coupled configuration including a connecting of the drain terminal of each transistor to the gate of the other transistor via one of the capacitors.

16. The comparator circuit of claim 9, wherein the cross-coupled configuration is enabled until a subsequent sampling of the offset voltages is commenced.

17. The comparator circuit of claim 9, wherein the offset voltages are approximations of actual offset voltages at the output nodes.

18. The comparator circuit of claim 9, wherein the transistors are n-channel metal-oxide-semiconductor (NMOS) transistors.

19. A method for canceling a set of offset voltages in an output of a comparator circuit that includes a latch, comprising:
disabling latch decision-making by preventing a pair of cross-coupled transistors from generating output of the latch;
after disabling the decision-making, sampling a pair of offset voltages that are input to drain terminals of the transistors, by placing each of the transistors into a diode-connected configuration while connecting respective first plates of a pair of capacitors to the drain terminals and connecting second plates of the capacitors together;
after sampling, applying offset-canceling voltages to the transistors by placing the transistors into a cross-coupled configuration in which the second plate of each capacitor is connected to a gate of an opposing one of the transistors; and
after applying the offset-canceling voltages, enabling latch decision-making by allowing the transistors to enter generate the latch output.

* * * * *